United States Patent
Hayden et al.

(10) Patent No.: US 9,067,790 B2
(45) Date of Patent: Jun. 30, 2015

(54) VAPOUR DEPOSITION PROCESS FOR THE PREPARATION OF A CHEMICAL COMPOUND

(75) Inventors: Brian Elliott Hayden, Chilworth Southampton (GB); Christopher Edward Lee, Chilworth Southampton (GB); Duncan Clifford Alan Smith, Chilworth Southampton (GB); Mark Stephen Beal, Chilworth Southampton (GB); Xiaojuan Lu, Chilworth Southampton (GB); Chihiro Yada, Aichi (JP)

(73) Assignees: Ilika Technologies Ltd., Chilworth, Southampton (GB); Toyota Motor Corporation, Aichi (JP)

( * ) Notice: Subject to any disclaimer, the term of this patent is extended or adjusted under 35 U.S.C. 154(b) by 0 days.

(21) Appl. No.: 14/117,827

(22) PCT Filed: Jul. 20, 2012

(86) PCT No.: PCT/GB2012/051741
§ 371 (c)(1),
(2), (4) Date: Nov. 14, 2013

(87) PCT Pub. No.: WO2013/011327
PCT Pub. Date: Jan. 24, 2013

(65) Prior Publication Data
US 2014/0072727 A1  Mar. 13, 2014

(30) Foreign Application Priority Data
Jul. 21, 2011 (GB) .................................. 1112600.0

(51) Int. Cl.
| | |
|---|---|
| C23C 14/34 | (2006.01) |
| C23C 16/513 | (2006.01) |
| C01B 25/30 | (2006.01) |
| C23C 14/24 | (2006.01) |
| C30B 23/06 | (2006.01) |
| C30B 23/08 | (2006.01) |
| H01M 4/58 | (2010.01) |
| H01M 4/04 | (2006.01) |
| H01M 4/136 | (2010.01) |
| H01M 4/1397 | (2010.01) |
| C23C 14/08 | (2006.01) |
| C01B 21/20 | (2006.01) |
| C01B 25/45 | (2006.01) |
| H01M 10/0525 | (2010.01) |

(52) U.S. Cl.
CPC .............. *C01B 25/30* (2013.01); *C23C 14/24* (2013.01); *C30B 23/066* (2013.01); *C30B 23/08* (2013.01); *H01M 4/5825* (2013.01); *H01M 4/0428* (2013.01); *H01M 4/136* (2013.01); *H01M 4/1397* (2013.01); *H01M 10/0525* (2013.01); *C23C 14/08* (2013.01); *H01M 4/0421* (2013.01); *Y02E 60/122* (2013.01); *C01B 21/203* (2013.01); *C01B 25/45* (2013.01)

(58) Field of Classification Search
CPC .... C23C 14/06; C23C 14/0623; C23C 14/24; C23C 14/54; C23C 16/30; C23C 16/305

USPC .......................................... 427/255.31, 255.38
See application file for complete search history.

(56) References Cited

U.S. PATENT DOCUMENTS

| | | | | |
|---|---|---|---|---|
| 4,649,024 | A * | 3/1987 | Brock et al. ................... | 427/593 |
| 4,878,989 | A * | 11/1989 | Purdes ........................... | 117/103 |
| 5,804,054 | A * | 9/1998 | Bhattacharya et al. ........ | 205/239 |
| 2005/0229856 | A1* | 10/2005 | Malik ........................... | 118/726 |
| 2007/0243338 | A1* | 10/2007 | Aslami et al. .................. | 427/569 |
| 2007/0269923 | A1* | 11/2007 | Lee et al. ........................ | 438/85 |
| 2008/0072962 | A1* | 3/2008 | Ishizuka et al. ............... | 136/264 |
| 2009/0325340 | A1* | 12/2009 | Aslami ........................... | 438/80 |
| 2010/0037824 | A1* | 2/2010 | Lee ............................ | 118/723 R |
| 2010/0079551 | A1* | 4/2010 | Saito et al. ...................... | 347/64 |
| 2010/0319777 | A1* | 12/2010 | Bae et al. ...................... | 136/262 |

FOREIGN PATENT DOCUMENTS

| | | |
|---|---|---|
| GB | 2 350 842 A | 12/2000 |
| WO | 2009/066286 A2 | 5/2009 |

OTHER PUBLICATIONS

Weyers, Markus, et al., "Growth of GaAsN alloys by low-pressure metalorganic chemical vapor deposition using plasma-cracked NH3". Appl. Phys. Lett., 62 (12), Mar. 22, 1993.*
Xu, Chongying, et al., "Chemical Vapor Deposition (CVD) of parylene films using liquid source delivery." Mat. Res. Soc. Symp. Proc. vol. 555, 1999.*
Eser, Erten, et al., "Critical issues in vapor deposition of Cu(InGa)Se2 on polymer web: Source spitting and back contact cracking." IEEE article, 2005, pp. 515-518.*
Ding, P.J., et al., "Effects of the addition of small amounts AI to copper: Corrosin, resistivity, adhesion, morphology, and diffusion". J. Apply, Phys., 75 (7), Apr. 1, 1994, 3627-3631.*
Invitation to Pay Additional Fees and Communication Relating to Results of the Partial International Search for corresponding PCT/GB2012/051741 (mailed Sep. 27, 2012).
Search Report for corresponding GB 1112600.0 (Nov. 17, 2011).
Hong et al., "Gas-Source Molecular Beam Expitaxy of GaInNP/GaAs and a Study of Its Band Lineup," J. Vac. Sci. Technol. B 19(4): 1413-1416 (2001).
Odnoblyudov & Tu, "Growth and Characterization of AIGaNP on GaP(100) Substrates," Appl. Phys. Lett. 88:071907-1-071907-3 (2006).
Communication and international Search Report and Written Opinion for corresponding PCT/GB2012/051741 (Mar. 12, 2015).
International Preliminary Report on Patentability for corresponding PCT/GB2012/051741 (Mar. 26, 2015).
* cited by examiner

*Primary Examiner* — Bret Chen
(74) *Attorney, Agent, or Firm* — LeClairRyan, a Professional Corporation

(57) ABSTRACT

A vapor deposition process for the preparation of a chemical compound, wherein the process comprises providing each component element of the chemical compound as a vapor, and co-depositing the component element vapors on a common substrate, wherein: the vapor of at least one component element is provided using a cracking source; the vapor of at least one other component element is provided using a plasma source; and at least one further component element vapor is provided; wherein the component elements react on the substrate to form the chemical compound.

22 Claims, 9 Drawing Sheets

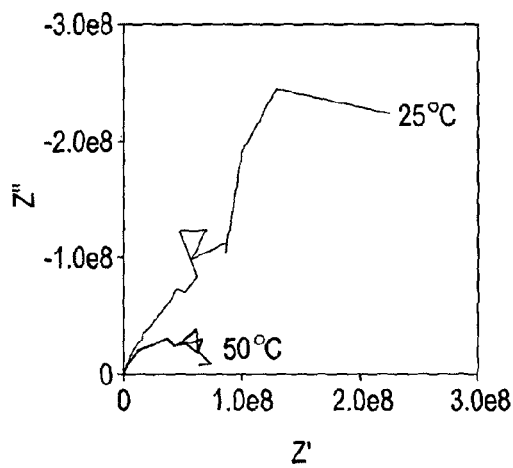 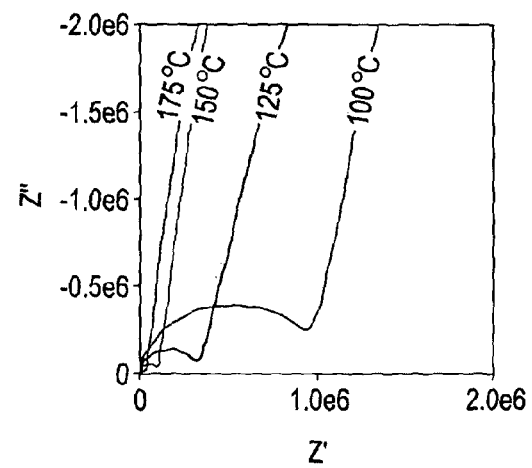
Fig. 4(a)        Fig. 4(b)
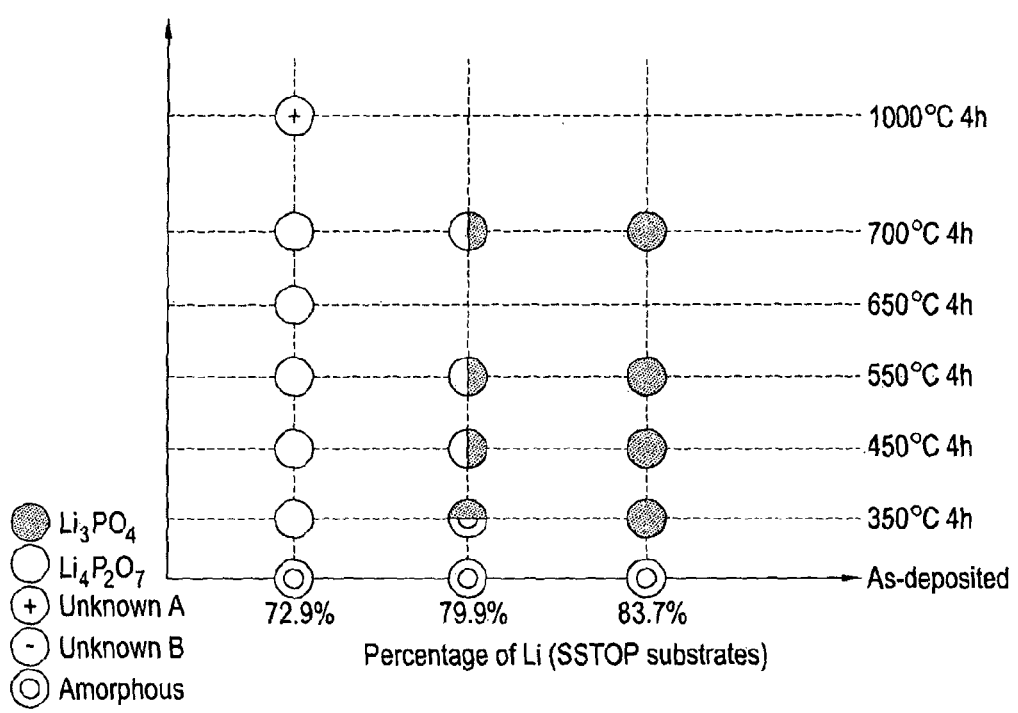
Fig. 5

VAPOUR DEPOSITION PROCESS FOR THE PREPARATION OF A CHEMICAL COMPOUND

This application is a national stage application under 35 U.S.C. §371 of PCT International Application No. PCT/GB2012/051741, filed Jul. 20, 2012, which claims the benefit of Great Britain Patent Application No. 1112600.0, filed Jul. 21, 2011, which is hereby incorporated by reference in its entirety.

The present invention provides a vapour deposition process for the preparation of a chemical compound. The present invention also provides a process for the manufacture of a battery utilising the vapour deposition process of the present invention.

Thin film materials have become important in a wide range of applications, such as in thin film semiconductors, thin film batteries, thin film photovoltaic cells and the like. As a consequence, there is a desire to be able to provide an ever-increasing range of materials as thin films. In particular, there is a desire to be able to discover, optimise, and manufacture chemical compounds for use in thin film applications more easily.

According to conventional methods, chemical compounds are generally prepared as thin films by first pre-preparing a target of the chemical compound, and then evaporating the pre-prepared target onto a substrate. Examples of methods which may be employed in this regard include sputtering (Park, H.; Nam, S.; Lim, Y.; Choi, K.; Lee, K.; Park, G.; Lee, S.-R.; Kim, H.; Cho, S. *Journal of Electroceramics* 2006, 17, 1023; Xie, J.; Imanishi, N.; Zhang, T.; Hirano, A.; Takeda, Y.; Yamamoto, O. *Journal of Power Sources* 2009, 192, 689; Lee, J. M.; Kim, S. H.; Tak, Y.; Yoon, Y. S. *Journal of Power Sources* 2006, 163, 173), using plasma laser deposition (PLD) (Kuwata, N.; Iwagami, N.; Matsuda, Y.; Tanji, Y.; Kawamura, J. *ECS Transactions* 2009, 16, 53), or using chemical vapour deposition (CVD) methods (Zhang, J. G.; Meda, L.; Maxie, E. System and Method of Producing Thin-Film Electrolyte; B05D 5112 ed., 2005; Vol. US 2005/0008772A1).

In theory, where a material is deposited on a substrate using a pre-prepared target, for example by sputtering, the chemical composition of the deposited thin film should be the same as that of the pre-prepared target. However, in practice, it is often the case that the deposited material has a different composition to that of the target, due to preferential evaporation of some components from the solid target. As a consequence, it is often difficult to control the exact composition of the thin films thereby produced. This lack of control presents significant difficulties when trying to optimise the composition of thin films, and also when trying to reliably reproduce thin films of a particular composition.

In view of the above, there is a need for a process enabling the reliable and reproducible preparation of chemical compounds, particularly in the form of thin films.

It has surprisingly been found that chemical compounds can be prepared directly from their individual component elements via a vapour deposition process.

SUMMARY OF INVENTION

According to a first aspect, the present invention provides a vapour deposition process for the preparation of a chemical compound, wherein the process comprises providing each component element of the chemical compound as a vapour, and co-depositing the component element vapours on a common substrate, wherein:

the vapour of at least one component element is provided using a cracking source;
the vapour of at least one other component element is provided using a plasma source; and
at least one further component element vapour is provided;
wherein the component elements react on the substrate to form the chemical compound.

In a preferred embodiment of the present invention, the vapour provided using a cracking source is selected from cracked phosphorus, cracked sulphur, cracked arsenic, cracked selenium, cracked antimony and cracked tellurium. The vapour provided using a cracking source is preferably cracked phosphorus or cracked sulphur, and most preferably cracked phosphorus.

According to a preferred embodiment of the present invention, the at least one other component element provided using a plasma source is selected from oxygen, nitrogen and hydrogen. Preferably, the at least one other component element provided using a plasma source is oxygen.

In a preferred embodiment of the present invention, the at least one further component element vapour is provided using an effusion cell source or using an electron beam evaporator source. The at least one further component element may be, for example, a metal, or may, for example, be selected from silicon, boron and carbon. In preferred embodiments, the at least one further component element is a metal. Preferred metals in this regard are selected from the group consisting of lithium, sodium, magnesium, calcium, a transition metal having an atomic number of 72 or less, aluminium, gallium, indium, germanium, tin, and lead. Particularly preferred metals include lithium, iron, aluminium, titanium, germanium, calcium, tin and cobalt, preferably lithium and iron, and most preferably lithium.

According to a preferred embodiment of the present invention, the component elements of the chemical compound are phosphorus, oxygen, and one or more metals, and the chemical compound is a metal phosphate or mixed metal phosphate. In some embodiments, such chemical compounds further comprise nitrogen, and the chemical compound is a nitrogen-doped metal or mixed metal phosphate.

According to a preferred embodiment of the present invention, the stoichiometry of the chemical compound is controlled by controlling the rate of deposition of each component element onto the substrate.

In some embodiments of the present invention, one or more of the component elements is/are deposited on the substrate with a concentration that varies across at least a portion of the substrate. In this case, a series of chemical compounds having different stoichiometries can be prepared on said portion of the substrate.

In a preferred embodiment of the present invention, a heated substrate is used. In another preferred embodiment, annealing is carried out following deposition.

According to a second aspect, the present invention provides a process for the manufacture of a battery, wherein the process includes a vapour deposition process according to the first aspect. In a preferred embodiment, the battery is a lithium ion battery.

BRIEF DESCRIPTION OF THE DRAWINGS

FIG. 4 shows the Z vs. Z" plots for a $Li_3PO_4$ sample that was annealed at 350° C. for 4 h in $O_2(g)$ as a function of the sample temperature.

FIG. 5 shows the crystalline phase composition as a function of annealing temperature and sample composition for a series of SSTOP//LiPOx samples.

DETAILED DESCRIPTION

Figure 1A:
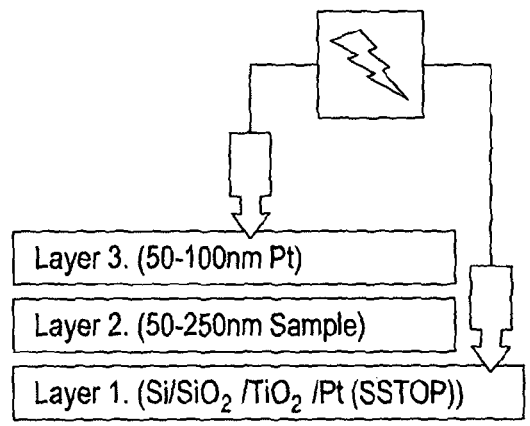
FIG. 1 is a schematic diagram of electrical measurement configurations for (a) through film measurements of ionic conductivity using impedance spectroscopy and (b) half-cell cyclic voltammetry measurements of electrode materials using a multichannel potentiostat and 100 element working electrode array substrate.

According to a first aspect, the present invention provides a vapour deposition process for the preparation of a chemical compound, wherein the process comprises providing each component element of the chemical compound as a vapour, and co-depositing the component element vapours on a common substrate, wherein:
  the vapour of at least one component element is provided using a cracking source;
  the vapour of at least one other component element is provided using a plasma source; and
  at least one further component element vapour is provided;
  wherein the component elements react on the substrate to form the chemical compound.

The process according to the present invention offers a number of advantages compared to known methods for the preparation of thin film chemical compounds. In particular, since each component element of the chemical compound is provided separately as a vapour, it is possible to control the evaporation rate, and thus deposition rate, of each component element separately. In this way, the preferential evaporation effects which occur during conventional techniques such as sputtering can be compensated for, and the composition of the deposited chemical compound can therefore be controlled and reproduced in an advantageous manner.

According to the present invention, each component element of the chemical compound is provided separately as a vapour. The term "element" in this context means "element of the periodic table". Thus, in the case that the chemical compound is $Li_3PO_4$, for example, then the component elements of the chemical compound are lithium (Li), phosphorus (P), and oxygen (O). According to the present invention, each of these three component elements would be provided separately as a vapour, that is separate lithium, phosphorus and oxygen vapours would be provided.

Preferably, each component element of the chemical compound is provided separately as a vapour at a respective source, i.e. one source per component element.

According to the present invention, the separate component element vapours are co-deposited on a common substrate, and react on the substrate to form the chemical compound. It is an important feature of the present invention that reaction of the component elements to form the chemical compound occurs on the surface of the substrate, and not in the vapour phase prior to deposition. Without wishing to be bound by theory, it is believed that each component element vapour collides with the surface of the substrate and sticks to the surface. It is believed that the atoms of each component element are mobile on the surface, and so are able to react with atoms of the other component elements, which are also stuck to the surface but mobile thereon, in order to form the chemical compound.

The process of the present invention is carried out in a vacuum, preferably in an ultra high vacuum (UHV). This ensures that the mean free path of vapour phase particles travelling in the vacuum (that is the mean distance traveled prior to collision with another particle) is long, so that vapour phase collisions between particles are minimised.

In order to minimise or eliminate vapour phase collisions between particles, the distance between each source and the substrate is preferably chosen so that the mean free path of the particles is longer than the distance between the source and the substrate. In this way, the vapour phase component elements can reach the substrate surface substantially without having undergone any vapour phase interactions.

Since there is no significant vapour-phase interaction between the particles, the process of the present invention can essentially be considered to be a physical vapour deposition (PVD) process. It has hitherto not been known to use PVD techniques and equipment to prepare chemical compounds from their individual component elements on the surface of a substrate.

The substrate for use in the present invention may be selected from suitable clean, flat substrates known to those skilled in the art. The only requirement of the substrate is that it should be compatible with the deposition conditions, for example with the vacuum environment during the deposition process.

Examples of suitable substrates include thermally grown oriented silicon with a native oxide layer (such as available from Nova Electronic Materials), multilayer $Si/SiO_2/TiO_2/Pt$ (SSTOP) (such as available from Nova Electronic Materials), or multi-electrode electrochemical array substrates (such as available from CIP Technologies).

In addition to the specific substrates mentioned above and other substrates described herein to exemplify the invention, it is possible to envisage a wide range of composite or pure materials for use as the substrate in the present invention. For example, in the case where the present invention is being applied to the manufacture of battery materials, anode or cathode materials may be deposited onto pre-existing components of the battery (one of the electrodes, the electrolyte, a current collector, or a carrier/interlayer for the films deposited according to the present invention). An example of a composite substrate that could be used as the substrate for the present invention is Lithium Ion Conducting Glass Ceramic (LICGC) available from Ohara Corp. In this case, the substrate would typically be the solid state electrolyte, and electrode materials (e.g., lithium iron phosphate) could be deposited onto the substrate to form the electrolyte/cathode subassembly of a lithium ion battery.

According to the present invention, the vapour of at least one component element is provided using a cracking source. By "cracking source" is meant a thermal cracking effusion source. Such sources are sources in which a component element that is a solid under standard conditions (i.e. STP, 100 kPa and 273.15 K) is evaporated to form a vapour at a first temperature, and is subsequently cracked to smaller and more reactive species at a substantially higher temperature. The use of such thermal cracking sources provides improved safety for handling toxic materials (such as $P_4$ and $P_2$).

Cracking sources (or simply "crackers") are known in the field of vapour deposition, and especially in the field of molecular beam epitaxy (MBE). Cracking sources are generally used as evaporation sources for high vapour pressure materials. Examples of such materials include phosphorus, sulphur, arsenic, selenium, antimony and tellurium. Thus, according to the present invention, the vapour provided using a cracking source may be selected from cracked phosphorus, cracked sulphur, cracked arsenic, cracked selenium, cracked antimony and cracked tellurium. Preferably, the vapour provided using a cracking source is cracked phosphorus or cracked sulphur, and most preferably cracked phosphorus.

In the case of phosphorus, for example, a phosphorus cracking source ("phosphorus cracker") would be employed. A phosphorus cracker is a known and commercially-available apparatus for converting commercially-available red phosphorus ($P_n$) into a controlled and reproducible flux of highly reactive vapour-phase phosphorus. The basic stages of operation of a phosphorus cracker are evaporation of red phosphorus to form white phosphorus ($P_4$) vapour, followed by cracking of $P_4$ to form reactive $P_2$. The white phosphorus vapour may be condensed and re-evaporated, or may be directly transported via a thermal cracking tube at a temperature in excess of 800° C.

In the case of sulphur, for example, a sulphur cracking source (a "sulphur cracker") would be employed. Like the phosphorus cracker already described above, sulphur crackers are known and commercially available. Sulphur crackers operate according to a similar principle to phosphorus crackers, in that a sulphur beam flux is generated from a sulphur source. Thus, elemental sulphur (predominantly $S_8$, although $S_6$ to $S_{20}$ are also present at STP) is evaporated at a first temperature, and is then passed through a second heated stage (e.g. 500 to 1000° C.) to form, for example, $S_7$ (500° C.) or $S_2$ (1000° C.). At much higher second stage temperatures (e.g. 2200° C.), elemental S atoms are predominantly formed in the vapour. Thus, the beam produced by a sulphur cracker may include $S_6$ and also smaller (cracked) sulphur species (e.g. $S_7$, $S_6$, $S_5$, $S_3$, $S_2$, and S). As explained above, the composition of the beam can be controlled by adjustment of the temperature in the cracking zone.

Cracking sources are also commercially available for producing a flux of arsenic, selenium, antimony and tellurium, and operate according to the same principles as described above.

Further information regarding cracking sources can be found in F. A. Cotton, G. Wilkinson, C. A. Murillo, M Bochman, "*Advanced Inorganic Chemistry*", 6th Ed., 1999, John Wiley and Sons.

According to the present invention, the vapour of at least one other component element is provided using a plasma source (plasma atom source), that is a source for the component element in the plasma phase. Plasma sources, for example RF plasma sources, are known in the field of vapour deposition, and especially in the filed of molecular beam epitaxy (MBE). Such sources are sources in which a component element that is a gas under standard conditions (i.e. STP, 100 kPa and 273.15 K) is transported into a deposition chamber via a tubular RF plasma reactor that excites the vapour using inductively coupled RF excitation, and causes dissociation into neutral atomic species/radicals and ions. This mixture is then directed at a substrate. Further information regarding plasma sources can be found in M. Ohring, "*Materials Science of Thin Films*", 2nd ed., 2002, Ch 4.

Plasma sources are typically used to produce beams of atomic nitrogen, oxygen and hydrogen, typically as a flux of atoms, radicals and ions. Thus, according to the present invention, the vapour provided using a plasma source may be selected from nitrogen, oxygen and hydrogen. Oxygen is particularly preferred.

Although it is preferred that each component element of the chemical compound be provided separately as a vapour at a respective source, i.e. one source per component element, it is possible for a single plasma source to provide the vapours of more than one component element. According to this embodiment, a mixed gas is supplied to the plasma source, and a mixed plasma beam is thus generated. For example, a single plasma source may be used to supply both oxygen and nitrogen. In this case, a mixture of oxygen and nitrogen is supplied to the plasma source, and a mixed flux of oxygen atoms, radicals and ions and nitrogen atoms, radicals and ions is produced. An advantageous feature of this embodiment of the present invention is that the ratio of the component elements supplied to the substrate by the joint plasma source can be controlled by controlling the ratio of the gases supplied to the plasma source. Thus, for example, nitrogen and oxygen vapours could be deposited on the substrate in a ratio of 1:4 by supplying the plasma source with 25% nitrogen gas ($N_2$) in oxygen gas ($O_2$). As will be apparent to those skilled in the art, essentially any desired ratio could be deposited on the substrate in this manner.

Although it is possible to provide the vapours of more than one component element using a single plasma source, it is important to note that the component elements thus provided are nonetheless deposited on the substrate as separate component elements, and only undergo reaction with the other component elements on the substrate. It is an important feature of the present invention that reaction of the component elements to form the chemical compound only takes place on the substrate, and not in the vapour phase prior to deposition.

According to the present invention, at least one further component element vapour is provided, in addition to the at least one component element vapour provided using a cracking source and the least one other component element vapour provided using a plasma source. Any suitable source type may be used for the vapour of the at least one further component element, and the choice will depend principally on the identity of the at least one further component element and according to criteria known to those skilled in the art. Preferred source types for the at least one further component element include effusion cell and electron beam evaporator sources, but other source types, such as gas injectors, may also be contemplated.

The at least one further component element vapour is preferably provided using an effusion cell source or using an electron beam evaporator source.

Effusion cells (commonly referred to as Knudsen cells or simply K-cells) are well known in the fields of physical vapour deposition (PVD) and molecular beam epitaxy (MBE). Effusion cells may be used to evaporate a very wide range of metals and other elements, and will usually be the preferred source for metals. Non-metals which may be evaporated using an effusion source include boron and silicon. Electron beam sources (often known simply as e-gun sources) may be more suitable in the case of some metals, including refractory metals such as niobium, molybdenum, tantalum and tungsten. Electron beam sources are also suitable for use in the case of carbon and silicon.

According to a preferred embodiment of the present invention, the at least one further component element is a metal or is selected from silicon, boron and carbon.

Essentially any metal or metals may be contemplated for use in the present invention, the only restriction being that it must be possible to provide the metal or metals as a vapour for deposition on a substrate. Examples of metals which may be used in the present invention include Group I metals such as lithium, sodium, potassium, rubidium and caesium; Group II metals such as beryllium, magnesium, calcium, strontium and barium; transition metals such as scandium, titanium, vanadium, chromium, manganese, iron, cobalt, nickel, copper, zinc, yttrium, zirconium, niobium, molybdenum, technetium, ruthenium, rhodium, palladium, silver, cadmium, lutetium, hafnium, tantalum, tungsten, rhenium, osmium, iridium, platinum, gold, and mercury; Group XIII metals such as aluminium, gallium and indium; group XIV metals such as germanium, tin and lead; Group XV metals such as bismuth; and Group XVI metals such as tellurium.

Preferred metals which may be used in the present invention are lithium, sodium, magnesium, calcium, transition metals having an atomic number of 72 or less (such as scandium, titanium, vanadium, chromium, manganese, iron, cobalt, nickel, copper, zinc, yttrium, zirconium, niobium, molybdenum, technetium, ruthenium, rhodium, palladium, silver, cadmium, lutetium and hafnium), aluminium, gallium, indium, germanium, tin, and lead. Particularly preferred metals include lithium, iron, aluminium, titanium, germanium, calcium, tin and cobalt.

Lithium and iron are especially preferred metals for use in the present invention, in particular in embodiments in which the chemical compound is a lithium phosphate or a mixed metal phosphate comprising iron and lithium. Examples of known phosphate compounds in this regard include lithium phosphate, lithium phosphorus oxynitride (LiPON), lithium aluminium metal phosphates (LAMP, $Li_{1+x}Al_xM_{2-x}(PO_4)_3$, M=Ti, Ge) and lithium iron phosphate (LFP, $LiFePO_4$). In the case of such lithium phosphates and mixed metal phosphates comprising iron and lithium, a further preferred embodiment provides that the chemical compound further comprises nitrogen, and wherein the chemical compound is a nitrogen-doped metal or mixed metal phosphate. An example of such a known phosphate compound is lithium phosphorus oxynitride (LIPON).

For the avoidance of doubt, it should be emphasised that there is no restriction to the number of component elements of the chemical compound prepared according to the present invention, besides the fact that there must be at least one component element vapour provided using a cracking source, at least one other component element vapour provided using a plasma source, and at least one further component element vapour.

A key advantage of the present invention is that, since each component element of the chemical compound is provided separately as a vapour, it is possible to control the evaporation rate, and thus deposition rate, of each component element separately. Accordingly, by controlling the deposition rates of each the component element vapours, the present invention allows the stoichiometry of the chemical compound to be controlled. Thus, according to a preferred embodiment of the present invention, the stoichiometry of the chemical compound is controlled by controlling the rate of deposition of each component element onto the substrate.

The means by which the rate of deposition is controlled will depend upon the type of source being used. In the case of an effusion cell, the rate of deposition is controlled by the temperature of the cell, which is both stable and reproducible. In the case of an electron beam evaporator source, the power applied to the sample controls the deposition rate. In the case of plasma sources, the flow rate and plasma power control the deposition rate. In the case of cracking sources, such as phosphorus crackers, the deposition rate is controlled by controlling the flow rate and by controlling the temperature (for example of the cracking zone). Controlling the temperature of the cracking zone in a cracking source also allows the composition of the beam to be controlled (for example, the amount of $P_2$ compared to $P_4$ in a phosphorus beam).

According to another advantageous embodiment of the present invention, one or more of the component elements is/are deposited on the substrate with a concentration that varies across at least a portion of the substrate. This embodiment allows a series of chemical compounds having different stoichiometries to be prepared on said portion of the substrate. This offers the opportunity to prepare and analyse a library of chemical compounds, thereby enabling discovery of a chemical compound which is optimised for a particular application. Once the optimised compound has been discovered, it may be produced according to the present invention by setting the deposition rates of the component elements accordingly. It is envisaged that this technique will facilitate discovery of a range of new and useful thin film materials, such as battery materials.

In order to deposit one or more of the component elements on the substrate with a concentration (thickness) that varies across at least a portion of the substrate, so-called "wedge shutters" may be employed to partially block the path between a given source and the substrate. The use of wedge shutters in this way is known in the art. According to a particularly advantageous arrangement, it is known that wedge shutters can be positioned between a source and a substrate such that the concentration of the vapour deposited on the substrate varies in a linear manner across the whole surface of the substrate, i.e. avoiding areas of no deposition or of constant deposition (plateaus). This arrangement is described in Guerin, S; Hayden, B. E., *J. Comb. Chem* 2006, 8, 66 and WO 2005/035820, the entire content of both of which is incorporated herein by reference.

The "as-deposited" materials prepared according to the present invention are generally amorphous to X-Rays, and can be partly or completely crystallised using ex-situ annealing treatments. Thus, according to an embodiment of the present invention, annealing is carried out following deposition. It is also possible to deposit onto heated substrates, which promotes in-situ crystallisation in the films. Thus, an embodiment of the present invention employs a heated substrate.

Although it is believed that the process of the present invention will find use in a wide range of applications, it is believed that it may find particular utility in the preparation of batteries, and in particular in the manufacture of thin-film electrolytes and/or electrodes. Thus, according to a second aspect, the present invention provides a process for the manufacture of a battery, wherein the process includes the vapour deposition process according to the present invention. In a preferred embodiment, the battery is a lithium ion battery.

Many lithium containing compounds, such as lithium phosphates, exhibit ionic conduction, and may therefore be considered for use in lithium ion batteries. These materials range from simple lithium ortho-phosphate (Kuwata, N.; Iwagami, N.; Matsuda, Y.; Tanji, Y.; Kawamura, J. *ECS Transactions* 2009, 16, 53) and nitrogen doped materials such as lithium phosphorus oxynitride (LiPON) (Bates, J. B.; Dudney, N. J.; Gruzalski, G. R.; Zuhr, R. A.; Choudhury, A.; Luck, C. F.; Robertson, J. D. *Journal of Power Sources* 1993, 43-44, 103), to complex multi-metallic phases such as the NASI-CON structures (for example, lithium aluminium germanium phosphate ($Li_{1+x}Al_xGe_{2-x}(PO_4)_3$, LAGP) (Thokchom, J. S.; Gupta, N.; Kumar, B. *Journal of The Electrochemical Society* 2008, 155, A915).

There is currently much interest in the development of solid-state lithium ion batteries. Conventional lithium ion batteries are typically composed of a lithiated carbon anode, a non-aqueous or polymer gel electrolyte, and a lithium cobalt oxide ($Li_xCoO_2$) cathode. Unlike these conventional batteries, solid-state lithium ion batteries employ a solid electrolyte. Solid-state batteries can offer several advantages when compared to conventional batteries, including increased volumetric and gravimetric energy densities, and an increase in the inherent safety of the battery. The fabrication of solid-state lithium ion batteries is traditionally carried out by a complex series of steps starting from separate inks and pellets of the electrode and electrolyte materials (Kobayashi, E.; Plashnitsa, L. S.; Doi, T.; Okada, S.; Yamaki, J. *Electrochem. Comm.* 2010, 12, 2010; Nagata, K.; Nanno, T. *J. Power Sources* 2007, 174, 832). There are also a number of reports describing the use of vacuum deposition methods in the production of solid-state lithium ion batteries (Kuwata, N.; Iwagami, N.; Matsuda, Y.; Tanji, Y.; Kawamura, J. *ECS Transactions* 2009, 16, 53; Xie, J.; Imanishi, N.; Zhang, T.; Hirano, A.; Takeda, Y.; Yamamoto, O.; Zhao, X. B.; Cao, G. S. *Journal of Power Sources* 2010, 195, 8341; Yada, C.; Iriyama, Y.; Abe, T.; Kikuchi, K.; Ogumi, Z. *Electrochemistry Communications* 2009, 11, 413).

The present invention offers an improved method for depositing thin film electrode and/or electrolyte materials, and therefore will be useful in the fabrication of both solid state and conventional batteries. In particular, it is believed that the deposition of thin film electrode and/or electrolyte materials directly from the elements will offer significant advantages compared to known methods using pre-prepared pellets or inks of the electrode/electrolyte materials.

The present invention also provides a means for the discovery and optimisation of new battery materials. Particular reference is made in this regard to the embodiments of the present invention in which one or more of the component elements is/are deposited on the substrate with a concentration that varies across at least a portion of the substrate, thereby enabling a series (library) of chemical compounds to be prepared across the surface of a substrate. In the context of the discovery and optimisation of battery materials, libraries may be produced according to this methodology and subsequently analysed, in order to identify promising candidate compounds for use as battery materials.

The use of other vacuum deposition methods for the fabrication of, for example, thin film Li ion batteries is described in the literature (for example Bates, J. B.; Dudney, N. J.; Gruzalski, G. R.; Zuhr, R. A.; Choudhury, A.; Luck, C. F.; Robertson, J. D. *Journal of Power Sources* 1993, 43-44, 103 or Kuwata, N.; Iwagami, N.; Matsuda, Y.; Tanji, Y.; Kawamura, J. *ECS Transactions* 2009, 16, 53 and a recent review of electrolytes for solid state micro-batteries Xie, H.; Wang, H. L.; Xiao, W.; Lai, M. O.; Lu, L. *Int. J. Surface Science and Engineering* 2009, 3, 23). In the case of the present invention a battery could be constructed by sequential deposition of an appropriate chemical compound onto a suitable, electrically conductive substrate. For example, sequential deposition of an anode layer (e.g., Li metal (from a Li evaporation source), an electrolyte layer (e.g., $Li_3PO_4$ (prepared using the method disclosed herein)), a cathode layer (e.g. $LiFe(PO_4)$, prepared using the method disclosed herein), and an electrically conductive lop layer (e.g., Pt (from a Pt evaporation source)) could be carried out to provide the layered structure of a thin film battery.

The invention will now be illustrated by means of the following examples, it being understood that these are intended to explain the invention, and in no way to limit its scope.

EXAMPLES

Experimental Methods and Materials

The method for the preparation of metal phosphate thin films described herein is a "physical vapour" co-deposition of the component elements using an appropriate geometric arrangement of elemental sources in a UHV environment. The metallic elements are deposited using either Knudsen cells (K-cells) or Electron Beam Sources (e-guns). Oxygen (and other gaseous elements) is deposited using a plasma source, and phosphorus is deposited using a multi-zone valved phosphorus cracker. The presence of wedge shutters in the path of the elemental sources can be used to create thickness gradients of the component elements on the substrate. The rate of deposition is controlled by the temperature of the K-cell which is stable and reproducible. In an e-gun source, the power applied to the sample controls the deposition rate. In the case of plasma sources, the flow rate and plasma power control the deposition rate. In the case of phosphorus crackers, it is the flow rate and temperature which are used to control the deposition rate.

The deposition rate as a function of position on the substrate is controlled by the wedge shutter. The incorporation of oxygen in the films is accomplished using a plasma atom source that converts $O_2(g)$ into a flux of oxygen atoms, radicals, and ions directed at the substrate.

The "as-deposited" materials are amorphous to X-Rays and can be partly or completely crystallised using ex-situ annealing treatments. It is also possible to deposit onto heated substrates. The use of heated substrates promotes in-situ crystallisation in the films.

Typically, the evaporation temperatures used for the metal components in K-cells are those that achieve a vapour pressure of around $10^{-2}$ Torr (1.33 Pa). Elements with deposition temperatures above around 1250° C. are usually evaporated using electron beam sources to achieve appreciable deposition rates. Lithium (granules, 99.9%, Sigma Aldrich) was evaporated from a 40 $cm^3$ pyrolytic boron nitride (PBN) crucible in a K-cell at temperatures ranging from 400 to 570° C. Iron was evaporated using an e-gun power of 16.4 to 19.9%, which corresponds to a deposition rate of 1.62-2.24 $Ås^{-1}$ as measured at the source using a quartz crystal microbalance. It is known for the system being used that the deposition rate at the substrate is approximately 0.35× the deposition rate measured near the source.

Oxygen was incorporated into the films using an atom (i.e. plasma) source operating at a power ranging from 300 W to 600 W with an $O_2(g)$ flow rate ranging from 1 to 5 sccm. Phosphorus was deposited using a phosphorus cracker (Veeco EPI-500V-P-IV 500 cm$^3$ valved cracking effusion source) with a white zone temperature ranging from 41.2 to 84.8° C.

The substrates used throughout were 35 mm×35 mm square wafers of approximately 1 mm thickness. The sample films were prepared on thermally grown oriented silicon (100) with a native oxide layer (Nova Electronic Materials), multilayer Si/SiO$_2$/TiO$_2$/Pt (SSTOP) (Nova Electronic Materials), or on multi-electrode electrochemical array substrates (CIP Technologies). To facilitate Raman characterisation and through-film electrical measurements, samples were deposited on SSTOP. The electrochemical array substrates were used for samples that were studied using cyclic voltammetry. Prior to use, all substrates were cleaned using a 50% (v/v) mixture of ethanol and UHP water then 2-propanol, and finally dried with a stream of N$_2$(g). The substrates were stored in covered Petri dishes until used, to prevent the accumulation of dust particles. To prevent disadvantageous contamination of the samples after synthesis, the samples were purged with Ar(g) and then vacuum packed with a sachet of desiccant.

The analysis of samples was carried out either on a 14×14 or a 10×10 grid with a pitch of 2.0 mm between analysis points. The samples for through-film impedance measurements were made on SSTOP substrates. After deposition of the sample layer, a 14×14 array of Pt contact pads with a diameter of 0.25 mm and a pitch of 2.0 mm were deposited using sputtering (Edwards S150B Sputter Coater). The typical contact pad thickness was approximately 100 nm.

The elemental compositions of samples were measured by Laser Ablation Inductively Coupled Plasma Mass Spectroscopy (ICP-MS) using a Perkin Elmer Elan 9000 ICP-MS equipped with a New Wave 213 nm laser. The ICP-MS analysis was done with reference to a pellet of standard material (e.g., Li$_3$PO$_4$, Sigma Aldrich 99%) or using NIST610 standard reference material. It was found that measurements made using the NIST610 underestimated the phosphorus content of the sample leading to an approximately 5% higher lithium content than the expected values.

The sample thicknesses were measured by ellipsometry (Woollam M-200FI Spectroscopic Ellipsometer). Using deposition times of 30 to 60 min, films were deposited with thicknesses ranging from 50 to 150 nm. The crystalline phase compositions were determined by X-ray diffraction (Bruker D8 diffractometer system equipped with a GADDS detector and a high intensity point source). The 2θ values quoted herein were measured using Cu Kα radiation. A typical collection was done using a 2θ range from 20 to 52° and a collection time of 4 minutes for each field of a 14×14 array sample. The phase composition of the samples was also determined using Raman Spectroscopy (HORIBA Xplora). The use of XRD and Raman spectroscopy provides complementary information about crystalline and amorphous phases in the deposited materials.

A schematic diagram showing the experimental configurations for determining conductivity and electrochemical properties are shown in FIG. 1. The electrical measurements were made using a probe station (Signatone S460) equipped with 2-point probe for DC I(t) measurements and a Solartron 1260 Impedance Analyser for impedance measurements (FIG. 1(a)).

Figure 1B:
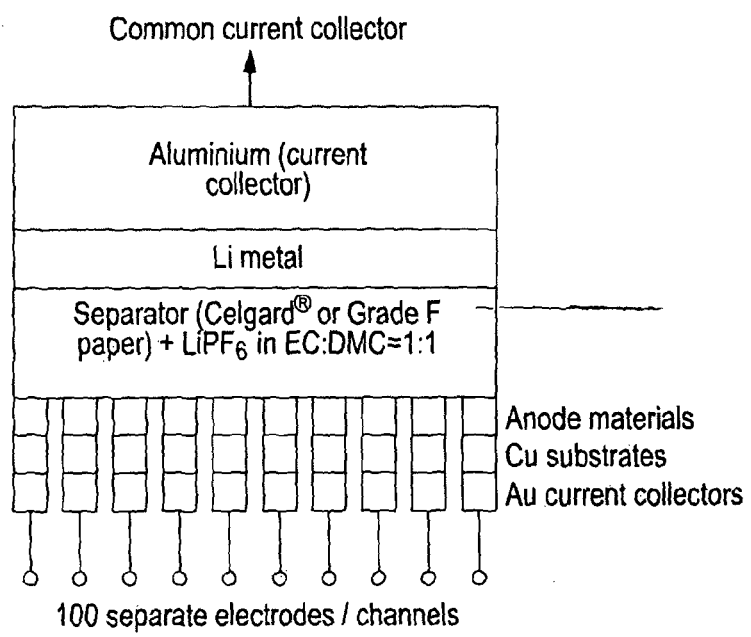

The electrochemical screening of the lithium iron phosphate (LiFePO$_4$, LFP) cathode materials was carried out using a multichannel potentiostat in a ½ cell configuration (FIG. 1(b)). The sample was deposited onto a 10×10 electrochemical array substrate composed of 100 individually addressable 1 mm×1 mm Au electrodes (Guerin, S.; Hayden, B. E.; Lee, C. E.; Mormiche, C.; Russell, A. E. *Journal of Physical Chemistry B* 2006, 110, 14355). The sample was then assembled into a ½ cell using a Celgard® separator soaked in the electrolyte (1 M LiPF$_6$ in 1:1 (vol.) mixture of ethylene carbonate (EC) and dimethylcarbonate (DMC)). A Li foil was applied on top of the electrolyte soaked separator and sandwiched in place with an Al current collector. The general details of the cell construction and electrochemical instrumentation have been described in the literature (Spong, A. D.; Vitins, G.; Guerin, S.; Hayden, B. E.; Russell, A. E.; Owen, J. R. *Journal of Power Sources* 2003, 119-121, 778). The electrochemical cell for testing was assembled in an Ar(g)-filled glove box and all electrical testing was done with the cell inside the glovebox.

Results and Discussion:

In the following Examples, the process of the present invention was used to deposit lithium ortho-phosphate (Example 1), mixtures of lithium ortho- and pyro-phosphates (Example 2), composition gradients containing mixtures of ortho- and pyro-phosphates (Example 3), lithium iron phosphate (Example 5), lithium phosphorus oxynitrides (Example 6), and lithium manganese phosphates (Example 7). A comparison of lithium ortho-phosphate prepared from the elements using the process of the present invention with materials prepared by RF sputtering of a Li$_3$PO$_4$ target (Example 4) is also included to demonstrate the superiority of the method disclosed herein.

Example 1

Deposition and Characterisation of Lithium Ortho-Phosphate (Li$_3$PO$_4$)

Figure 2:
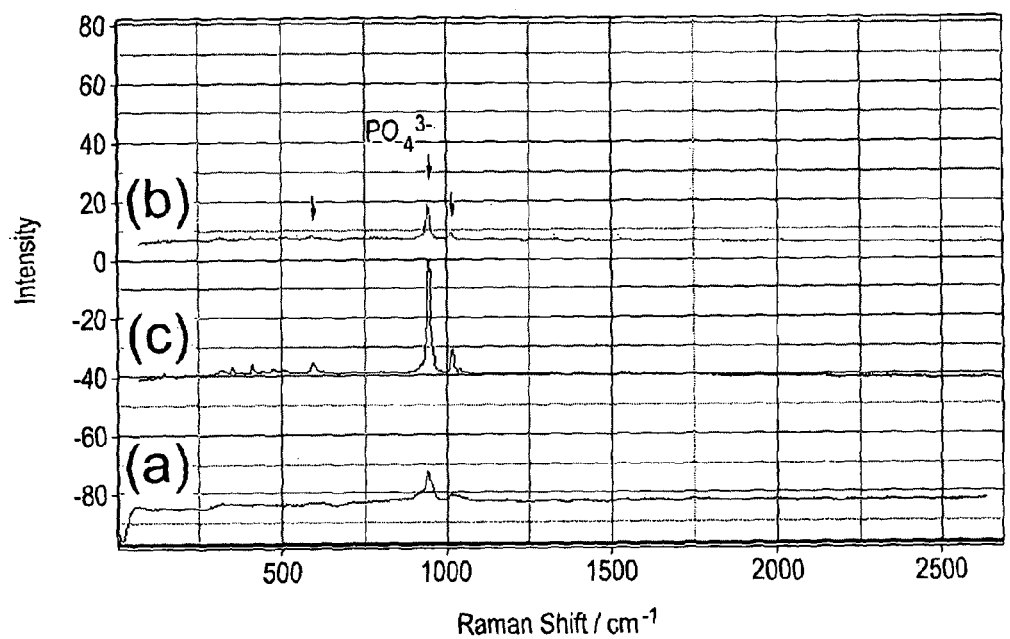
FIG. 2 shows the Raman spectra observed for (a) as-deposited $Li_3PO_4$ and the same sample after annealing at (b) 550° C. and at (c) 700° C. for 4 h in an $O_2(g)$ atmosphere.
Figure 3:
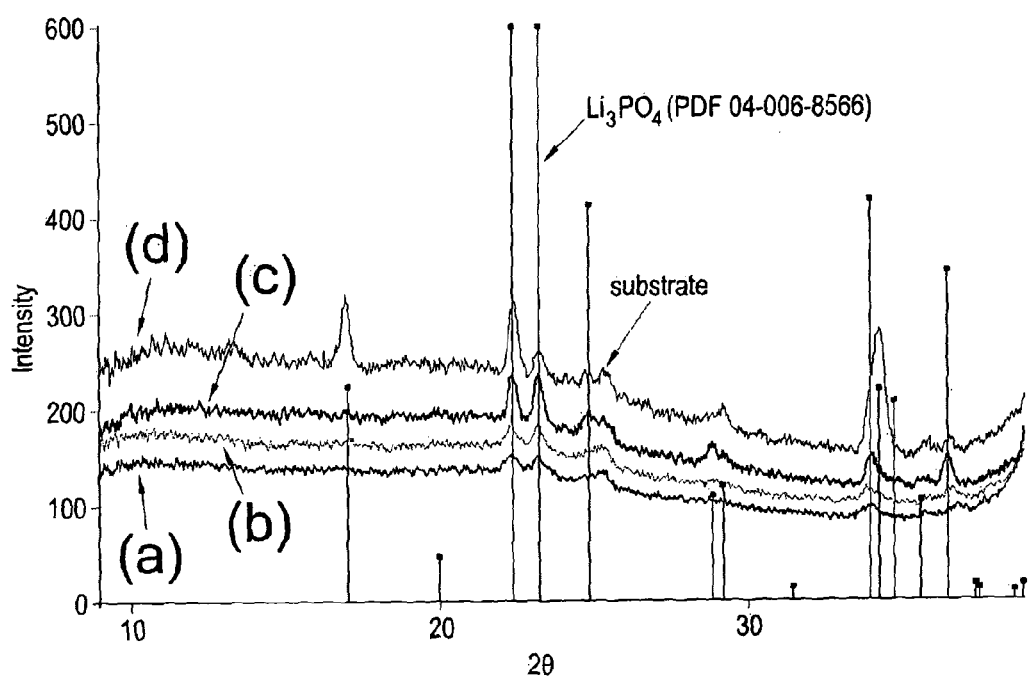
FIG. 3 shows XRD patterns observed for a set of uniform SSTOP//LiPOx samples (These samples were obtained by dicing a single uniform sample into 9 pieces) after annealing at (a) 350° C., (b) 450° C., (c) 550° C., and (d) 700° C. The samples were annealed using standard conditions (i.e., 3° C. $min^{-1}$, 4 h, in an $O_2$ atmosphere).

A series of uniform composition samples were prepared for characterisation and electrical measurements. The deposition of Li$_3$PO$_4$ films was achieved by co-depositing Li, P, and O in the appropriate atomic ratios on Si and Si/SiO$_2$/TiO$_2$/Pt (SSTOP) substrates. The evidence for the formation of the phosphate is the observation of the expected Raman bands in the as deposited sample at approximately 950 cm$^{-1}$ and the observation of corresponding X-ray powder patterns in the samples after annealing in an oxygen gas atmosphere (FIGS. 2 and 3). The ionic conductivities of a series of Li$_3$PO$_4$ samples were measured as a function of annealing temperature. The results of impedance and DC measurements are shown in Table 1.

TABLE 1

The electrical properties of Li$_3$PO$_4$ thin film samples measured using impedance spectroscopy and DC current decay curves at constant voltage. (N.b., the RAC values correspond to the low frequency Z' at which blocking responses start to be observed).

| $T_{an}$/° C. | T/° C. | $\sigma_{AC}$/S cm$^{-1}$ | $R_{AC}$/Ω | $R_{DC}$/Ω |
|---|---|---|---|---|
| 25 | 25 | 1.11E−07 | 2.54E+05 | 6.46E+07 |
| 350 | 25 | 2.58E−09 | 3.16E+08 | 2.45E+08 |
| 350 | 100 | 2.18E−08 | n/a | n/a |
| 450 | 100 | 5.43E−08 | 8.89E+05 | 8.08E+10 |
| 550 | 25 | 2.69E−09 | 3.62E+08 | 8.62E+09 |
| 550 | 100 | 1.14E−09 | 4.23E+07 | 5.38E+09 |

In FIG. 2, the Raman spectra observed for as-deposited Li$_3$PO$_4$ and for the same material after annealing at 550 and 700° C. are shown. The bands at approximately 950 and 1025 cm$^{-1}$ indicate the presence of the PO$_4$$^{3-}$ component of Li$_3$PO$_4$ and are in agreement with the literature (Popovi, L.; Manoun, B.; de Waal, D.; Nieuwoudt, M. K.; Comins, J. D. *Journal of Raman Spectroscopy* 2003, 34, 77). It is apparent from the non-annealed sample (a) that the target material is formed in the amorphous state during the deposition rather than as a result of chemical reactions occurring during the annealing process. Therefore, the synthesis conditions (i.e., relative amounts of the component elements) determines the phase, and the annealing conditions determine the degree of crystallization (i.e., state) of that phase. The composition of the film determined by ICP-MS is 83.7 At. % Li which is larger than the expected 75 At. % due to a systematic error in the measurement method (see Experimental Methods).

In FIG. 3 the XRD patterns observed for a series of samples after annealing at temperatures from 350° C. to 750° C. are shown. It is apparent from the data shown that the amount of crystalline phase (i.e., degree of crystallisation) of the sample increases with annealing temperature and that no other crystalline phases are present. The films all have an elemental composition of 75±1 at. % Li relative to P in LiPOx determined using a Li$_3$PO$_4$ pellet as the standard reference for ICP-MS which alleviated the systematic error mentioned above.

The electrical properties of the samples were determined using impedance spectroscopy and from DC I(t) decay curves at constant voltage. It is thought that the AC impedance gives a measure of the ionic conductivity of the sample (provided a blocking spike is observed in the Z' vs. Z" plot) and that at sufficiently long times the DC resistance gives a measure of the electronic conductivity of the material. The total ionic conductivities and DC resistances of a series of as-deposited (amorphous) Li$_3$PO$_4$ and of similar annealed samples are shown in Table 1. In most cases the R$_{DC}$ values are at least 1 to 2 orders of magnitude larger than the low frequency R$_{AC}$ values indicating that Li$_3$PO$_4$ is an ionic conductor with low electronic conductivity which is desired for a suitable solid state electrolyte. These values are in agreement with expectations. In particular, that the ionic conductivity of Li$_3$PO$_4$ is larger in the amorphous material than in the crystalline or vitreous ceramic states.

In FIG. 4, the Z vs. Z" plots for a Li$_3$PO$_4$ sample that was annealed at 350° C. for 4 h in O$_2$(g) are shown as a function of the sample temperature. It is apparent from measurements made at 25 and 50° C. (FIG. 4(a)) that the ionic conductivity of the crystalline material is very low. Upon heating above 100° C., the conductivity increased and the blocking spike expected for an ionic conductor is observed. The actual conductivities observed for this range of temperatures are shown in Table 2.

TABLE 2

The total ionic conductivities as a function of temperature for a sample of Li$_3$PO$_4$ annealed at 350° C.

| T$_{an}$/° C. | σ$_{AC}$/S cm$^{-1}$ |
|---|---|
| 25 | 3.86E−09 |
| 50 | 5.40E−09 |
| 100 | 2.18E−08 |
| 125 | 3.75E−08 |
| 150 | 1.25E−07 |
| 175 | 6.53E−07 |

In summary, the physical co-deposition of the elements Li, P, and O using appropriate UHV compatible sources and in the correct atomic ratio results in the formation of the target material (i.e., Li$_3$PO$_4$) in the amorphous state. This method is superior to other deposition methods.

Example 2

Deposition and Characterisation of Mixtures of Lithium Ortho- and Pyro-Phosphate (Li$_3$PO$_4$ and Li$_4$P$_2$O$_7$)

In a manner similar to Example 1, the deposition of mixed phases (i.e., lithium ortho-phosphate (Li$_3$PO$_4$) and lithium pyro-phosphate (Li$_4$P$_2$O$_7$) films) or pure lithium pyro-phosphate was achieved by co-depositing uniform layers of Li, P, and O in the appropriate atomic ratios on Si and Si/SiO$_2$/TiO$_2$/Pt (SSTOP) substrates. In FIG. 5 the results of XRD analysis of a series of LIPOx samples with Li contents ranging from 72.9 to 83.7 at. % Li are shown as a function of annealing temperature (Note: The compositions were measured vs. NIST 610 and thus have a systematic error that over estimates the Li content relative to P by approximately 5 at. %). It is apparent from this data that the nature of the material synthesised depends, among other things, primarily on the atomic composition of the film. The composition of each specific point on the sample is determined by the relative deposition rates of the component elements at that point, which rates are identical across the sample field.

Example 3

Figure 6:
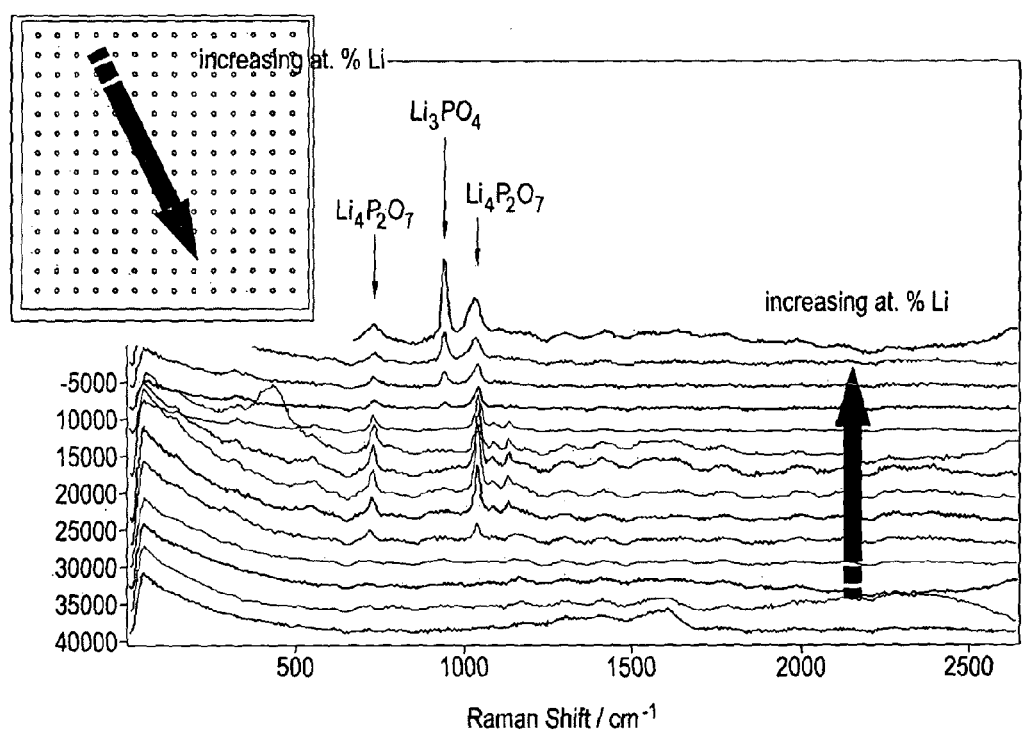
FIG. 6 shows the Raman spectra of a gradient SSTOP//LiPO film after annealing to 350° C. The spectra were recorded along the diagonal composition gradient. The Li content varies as indicated by the arrows. The bands assigned to $PO_4^{3-}$ and $P_2O_7^{4-}$ are indicated by the arrows.

Deposition and Characterisation of Mixtures of Lithium Ortho- and Gyro-Phosphate (Li$_3$PO$_4$ and Li$_4$P$_2$O$_7$) as Gradients on a Single Substrate The co-deposition of a gradient of Li metal in the presence of atomic P and O produces a compositional variation across the sample substrate. This method of physical vapour deposition is termed Wedge Growth PVD (or HT-PVD). As shown above (Example 1), conclusive evidence for the formation of the target lithium phosphates is the observation of the expected Raman spectrum for the materials. According to the wedge growth effect, the composition of a specific point on the sample is determined by the relative deposition rates of the component elements at that point, which in this example is determined by the wedge gradient imposed on the Li source. A gradient composition sample was prepared in which a constant flux of oxygen and phosphorus was present during the deposition of a gradient in the Li content. The Raman spectra obtained as a function of position (and thus composition) on the substrate are shown in FIG. 6. The spectra were obtained from a gradient sample after annealing at 350° C.

In Summary, using the method it is possible to prepare pure Li phosphates and mixtures of ortho- and pyro-phosphate phases in an amorphous state. In this context "amorphous" refers to a state of the material that lacks sufficient long range order to produce a X-ray diffraction pattern.

Example 4

Comparison of Sputtered Deposited Lithium Ortho-Phosphate with Similar Materials Prepared Using the Method A set of lithium phosphate thin films was prepared using RF sputtering to provide a comparison with the materials prepared according to the present invention. The samples were deposited onto a platinum coated silicon substrate (Si/

SiO$_2$/Cr/Pt). The thickness of the samples ranged from 220±21 nm to 358±16 nm depending on the deposition time. The sputtered Li$_3$PO$_4$ samples are visually uniform samples across most of the film, the bands of colour around the edges of the film are a result of a thickness gradient in this region. Annealing of the films resulted in the formation of a mottled surface. Such large changes in the optical appearance of the samples were not observed after annealing of SSTOP//LiPOx samples prepared using the physical vapour deposition (PVD) method disclosed herein. The phase composition of the sputtered samples was analysed using XRD and Raman spectroscopy. The as-deposited sputtered Li$_3$PO$_4$ samples showed the presence of P$_2$O$_5$ in XRD measurements. This phase has not been observed on Li$_3$PO$_4$ samples prepared using PVD. After annealing at 350° C. the sputtered sample showed lighter and darker regions. The XRD patterns observed in the two regions are similar and can be assigned to a mixture of Li$_3$PO$_4$ and LiPt$_7$. After annealing at 450° C. the sample appears rough and mottled. The XRD patterns show the presence of a mixture of Li$_3$PO$_4$, Li$_2$PtO$_3$, Li$_2$C$_2$O$_4$ and AlPO$_4$. The presence of an aluminium phase in the sample is unexpected and may arise from the crucible used in the annealing process. Analysis of the sputtered samples by Raman spectroscopy confirmed the presence of the PO$_4^{3-}$ from the v$_1$ band at approximately 950 cm$^{-1}$, but the spectra are rather more complex than those observed for vapour deposited materials.

Impedance and DC measurements were made on the sputtered samples using the same conditions as for the SSTOP//LiPOx samples prepared by HT-PVD. The results are summarised in Table 3. As is the case for the vapour deposited materials, the ionic conductivity was found to decrease significantly upon annealing. The electrical resistance of the sputtered sample annealed at 450° C. was too large to be determined. The electrical properties of the as-sputtered Li$_3$PO$_4$ material are similar to those of the as-prepared vapour-deposited lithium phosphate. The R$_{DC}$ values are approximately 2 orders of magnitude higher than the R$_{AC}$ values and the total ionic conductivities of both materials are approximately 10$^{-7}$ S cm$^{-1}$. Upon annealing the total ionic conductivities of the sputtered samples decrease more significantly, which is likely due to the presence of significant amounts of secondary phases as shown by XRD.

TABLE 3

The electrical properties of sputtered Li$_3$PO$_4$ thin film samples measured using impedance spectroscopy and DC current decay curves at constant voltage.

| T$_{an}$/° C. | T/° C. | σ$_{AC}$/S cm$^{-1}$ | R$_{AC}$/Ω | R$_{DC}$/Ω |
|---|---|---|---|---|
| 25 | 25 | 1.31E−07 | 5.65E+05 | 5.83E+08 |
| 350 | 100 | 3.12E−09 | 5.49E+07 | 2.76E+09 |
| 450 | 100 | n/a | n/a | n/a |

In summary, samples of sputtered Li$_3$PO$_4$ are not identical to vapour deposited Li$_3$PO$_4$ prepared using the method of the present invention. The XRD analysis of sputtered and vapour-deposited Li$_3$PO$_4$ samples shows significant differences. The complex mixture of phases observed for annealed sputtered samples is not observed for Li$_3$PO$_4$ samples prepared using HT-PVD. Also, the presence of Li and Pt phases (e.g., Li$_2$PtO$_3$) is not observed for vapour-deposited LiPOx samples. The sputtered samples contain a more complex phase composition and are shown to have lower total ionic conductivities after annealing compared to phase pure Li$_3$PO$_4$ prepared using physical vapour deposition. It is also possible that differences in sample handling procedures and substrate effects also contribute to the observed differences. In the physical vapour deposition process, elemental sources are used to provide a flux of each component element at the target substrate. Upon impact with the substrate (and assuming an effective sticking probability of unity), the absorbed elements are mobile and react with each other to form the target material (provided the appropriate deposition conditions and substrate are selected). In the case of sputtering the chemistry is done ahead of the deposition process. That is, the target material is evaporated by the incident plasma and clusters of the material are vaporised and then deposited on the substrate. A significant difference between these methods is that using our physical vapour deposition method the relevant reactions occur on the surface of the substrate. Although some reactions may proceed to a minute extent in the gas phase, these are not routes to the target material.

Example 5

Deposition and Characterisation of Lithium Iron Phosphate

The method disclosed herein is not limited to the preparation of simple binary phosphates (e.g., LiPO$_4$). It is known that lithium iron phosphate is a useful cathode material for Li ion batteries. In a manner similar to the lithium phosphates described above, the deposition of lithium iron phosphate (LiFe(PO$_4$), LFP) was achieved by co-depositing Li, Fe, P, and O in the appropriate atomic ratios on Si and Si/SiO$_2$/TiO$_2$/Pt (SSTOP) substrates. The evidence for the formation of the target phosphate is the observation of the expected Raman bands in the as deposited sample at approximately 950 cm$^{-1}$ and the observation of corresponding X-ray powder patterns in the samples after annealing in argon-hydrogen gas atmosphere. Further, the property of interest in these studies was the specific capacity which was measured as a function of sample composition using a high throughput electrochemical ½ cell method.

Figure 7A:
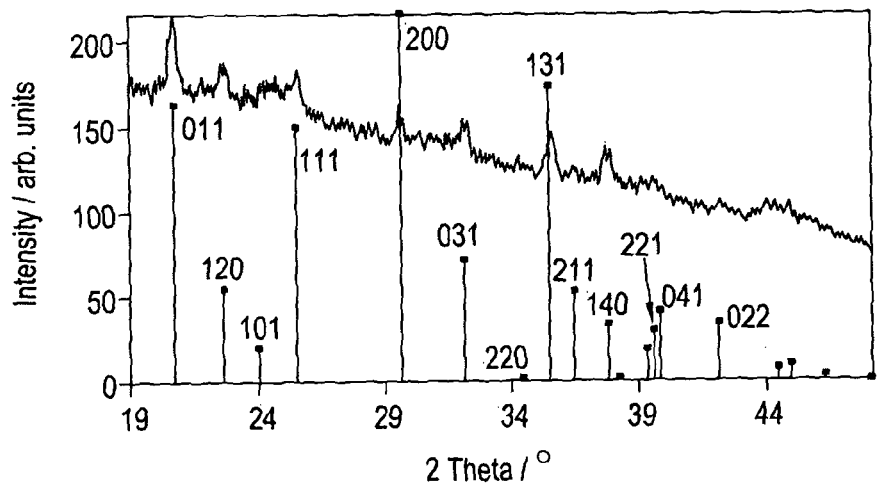
FIG. 7 shows (a) a typical XRD Pattern for a $LiFePO_4$ obtained from analysis of a 10×10 array and (b) the integrated area under the main $LiFePO_4$ peak as a function of composition.
Figure 7B:
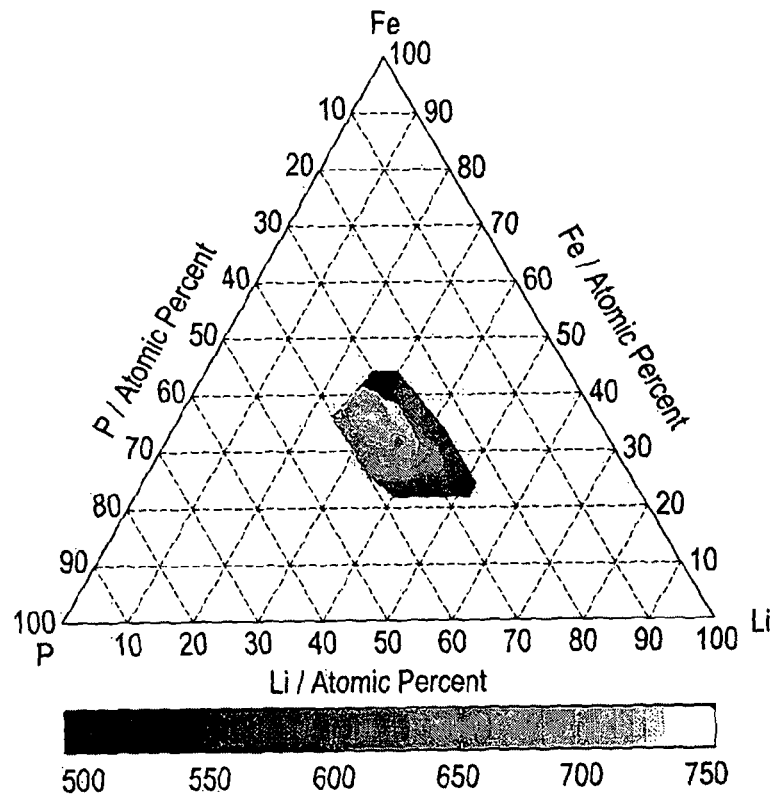
Figure 8A:
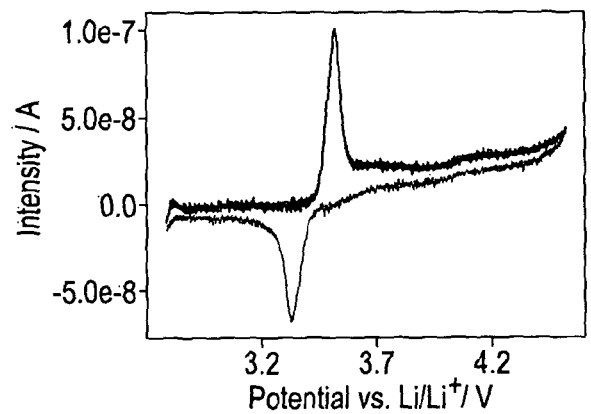
FIG. 8 shows (a) a typical voltammogram from a 10×10 array recorded at 0.05 mV $s^{-1}$ between 2.8 and 4.3 V vs. Li/Li+ is shown. In (b) the $1^{st}$ discharge capacities extracted from voltammograms measured for the range of compositions studied are shown. The specific capacities were calculated using thicknesses measured by optical profilometry and assuming the sample is 100% dense $LiFePO_4$ (d=3.6 g $cm^{-3}$).
Figure 8B:
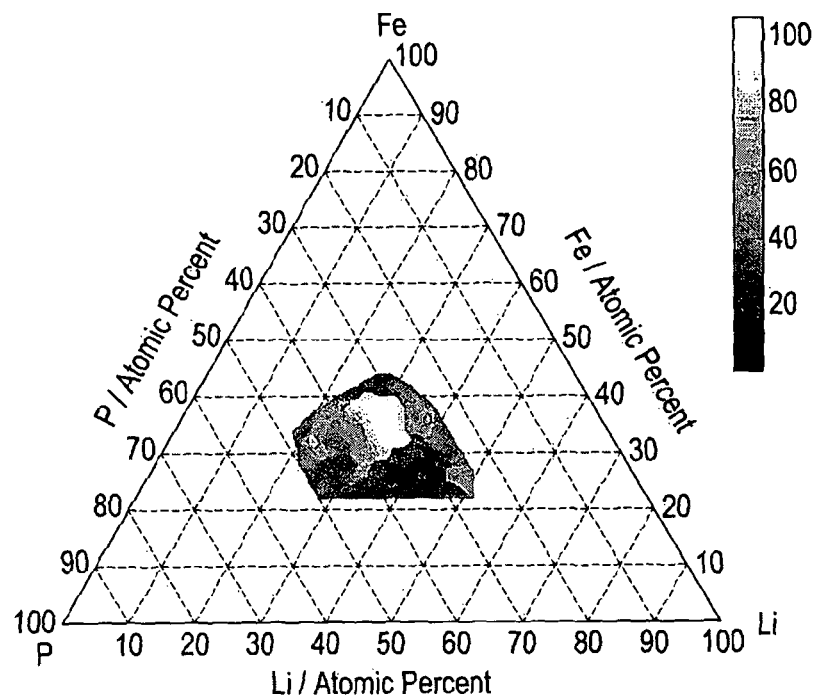

The XRD data shown in FIG. 7 demonstrate that single phase olivine LiFePO$_4$ is obtained after annealing the as-deposited (amorphous) sample in 95:5 Ar:H$_2$ for 6 h at 500° C., though the relative intensities are different from reported values due to preferential orientation of the material on the substrate. The observed capacity was 100 mAhg$^{-1}$, which is lower than the theoretical capacity of 169 mAhg$^{-1}$. The XRD characterisation and electrochemical measurements on LFP thin films prepared using the method show that the target phase is formed and that the specific capacity as a function of composition (FIG. 8) is in general agreement with the literature (Padhi, A. K.; Nanjundaswamy, K. S.; Goodenough, J. B. *Journal of The Electrochemical Society* 1997, 144, 1188).

Example 6

Deposition and Characterisation of Lithium Phosphorus Oxynitrides

Thin films of lithium phosphorus oxynitride (LiPON) are usually prepared by sputtering of lithium ortho-phosphate in a nitrogen environment (Yu, X., Bates, J. B., G. E. Jellison, J., Hart, F. X., *Journal of the Electrochemical Society* 1997, 144, 524).

Figure 9:
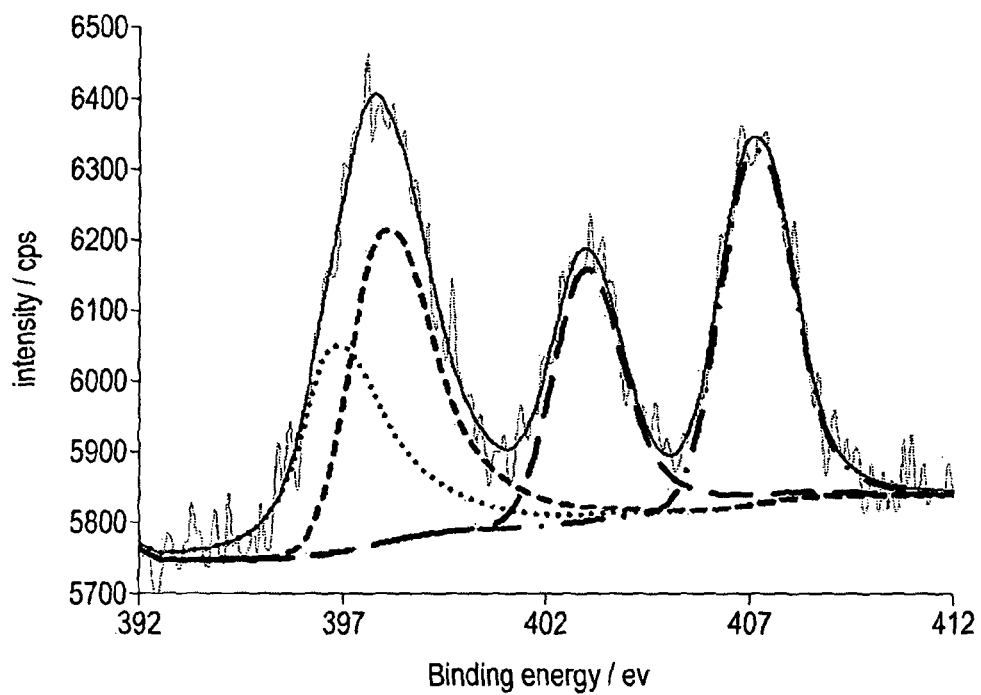
FIG. 9 shows the XPS spectrum for the N1s region for a sample containing 66 at. % Li (relative to phosphorus) prepared using 25% $N_2$ in $O_2$. The fitted peaks show the different N bonds present on the surface of the sample.

A series of graded composition samples were prepared by co-depositing Li, P, O and N for characterisation on SSTOP substrates. The amounts of nitrogen and oxygen were varied by altering the ratio of molecular oxygen to molecular nitrogen in the supply to the plasma source. The evidence for the formation of the phosphate is the observation of the expected Raman bands in the as deposited sample at approximately 950 cm$^{-1}$ (Popovi, L., Manoun, S., de Waal, D., Nieuwoudt, M. K., Comins, J. D. *Journal of Raman Spectroscopy* 2003, 34, 77). The evidence for the incorporation of nitrogen to form the lithium phosphorus oxynitride is the observation of the expected N1s peaks using X-Ray Photoelectron Spectroscopy as shown in FIG. 9. The peak at 397 eV can be assigned to the doubly-bonded N, whilst the peak at 399 eV can be assigned to the triply-bonded N to P, which are known to form part of the bonding network in the amorphous lithium phosphorus oxynitride materials.

The ionic conductivities were measured for a sample prepared with pure molecular oxygen and a sample prepared using 5% nitrogen at 75° C. and found to be 1×10$^{-6}$ S cm$^{-1}$ and 1×10$^{-5}$ S cm$^{-1}$ respectively. Thus the incorporation of nitrogen shown in this example leads to an improvement in the conductivity of 1 order of magnitude.

In summary, the physical co-deposition of the elements Li, P, O and N using appropriate UI-IV compatible sources and in the correct atomic ratio results in the formation of the target materials (LiPON) in the amorphous state. This method is superior to other deposition methods due to the degree of control of the elemental composition and other reasons that will be clear to those skilled in the art of thin film deposition methods.

Example 7

Deposition and Characterisation of Lithium Manganese Phosphates

In a manner similar to the lithium iron phosphates described above, the deposition of lithium manganese phosphate (LiMnPO$_4$, LFP) was achieved by co-depositing Li, Mn, P, and O in the appropriate atomic ratios on (SSTOP) substrates. The evidence for the formation of the target phosphate is the observation of the expected Raman bands in the as deposited sample at approximately 950 cm$^{-1}$ and the observation of corresponding X-ray powder patterns in the samples after annealing in an argon-hydrogen gas atmosphere.

Figure 10:
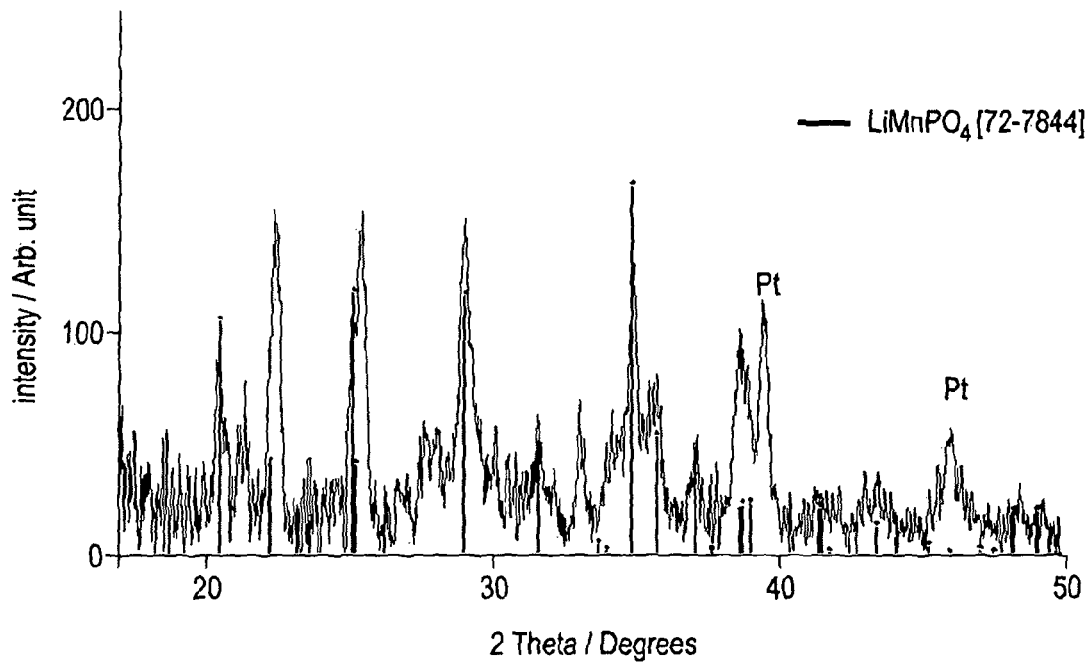
FIG. 10 shows the XRD pattern of an $LiMnPO_4$ sample annealed at 600° C. in Ar, 3 hours.

The XRD data shown in FIG. 10 demonstrate that single phase olivine LiMnPO$_4$ is obtained after annealing the as-deposited (amorphous) sample in Ar for 3 h at 600° C., though the relative intensities are different from reported values due to preferential orientation of the material on the Pt substrate (marked).

Figure 11:
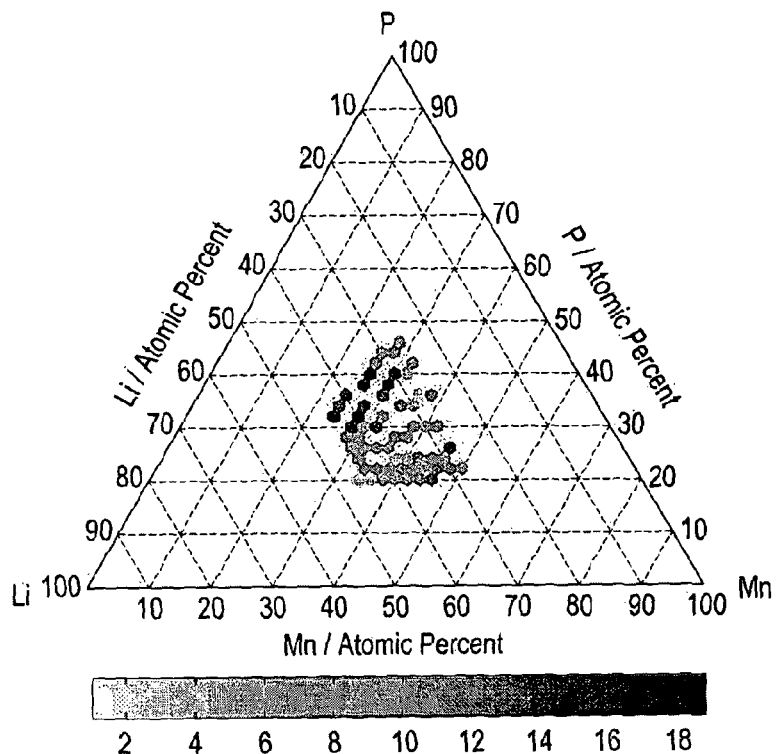
FIG. 11 shows the area under the $LiMnPO_4$ [111] XRD peak for an array of samples with variable Li—Mn—P(O) composition.

The area under the LiMnPO$_4$ [111] XRD peak is shown in FIG. 11 for an array of Li—Mn—α-O materials with graded compositions. This parameter shows the predominance of LiMnPO$_4$ materials with the olivine crystal structure in the nominal area of the Li—Mn—P(O) ternary diagram (i.e., Li:Mn:P=1:1:1) which is in good agreement with literature data.

Figure 12:
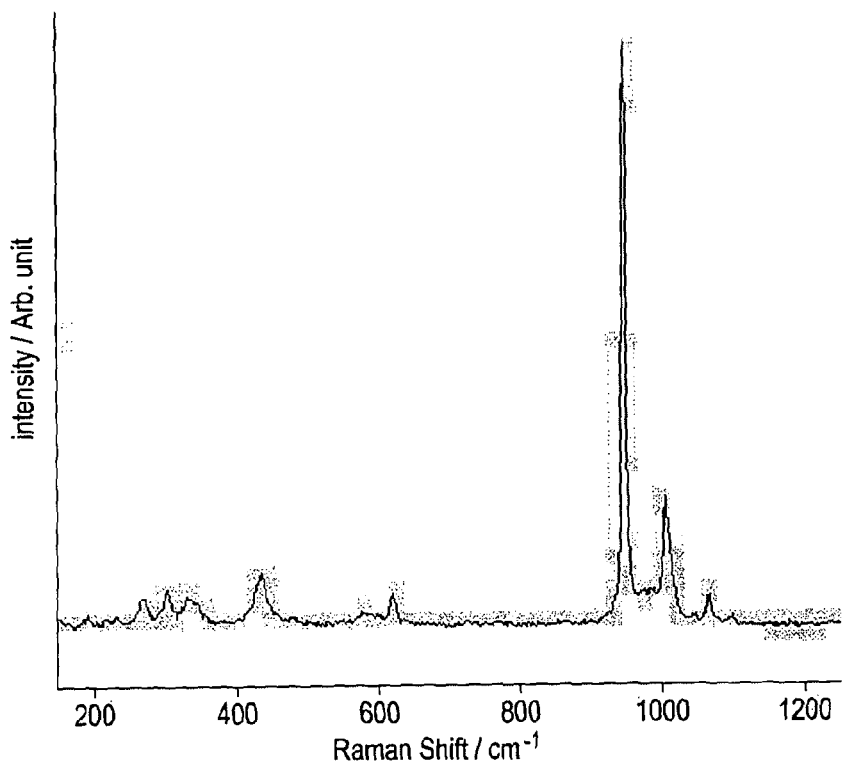
FIG. 12 shows the Raman spectrum of a $LiMnPO_4$ sample annealed at 600° C. in Ar, 3 hours.
Figure 13:
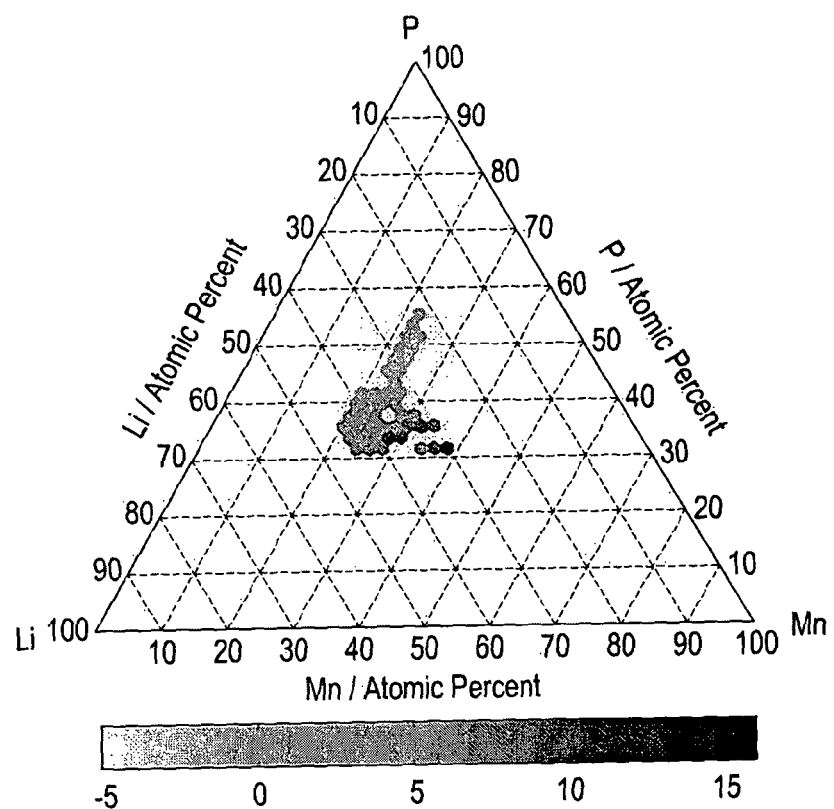
FIG. 13 shows the area under the $LiMnPO_4$ Raman band ~950 $cm^{-1}$ for an array of samples with variable Li—Mn—P(O) composition.

A typical Raman spectrum for LiMnPO$_4$ material is shown in FIG. 12 and is in good agreement with reported literature data. The area under the LiMnPO$_4$ Raman band at ~950 cm$^{-1}$ is shown in FIG. 13 for an array of Li—Mn—α-O materials with graded compositions. This parameter shows the predominance of LiMnPO$_4$ materials with the olivine crystal structure in the nominal area of the Li—Fe—P (O) ternary diagram, i.e. Li:Mn:P=1:1:1, in good agreement with literature data.

The invention claimed is:

1. A physical vapour deposition (PVD) process for the preparation of a chemical compound, wherein the process comprises providing each component element of the chemical compound as a vapour, and co-depositing the component element vapours on a common substrate, wherein:
   the vapour of at least one component element is provided using a thermal cracking effusion source;
   the vapour of at least one other component element is provided using a plasma source, said plasma source being a source for said at least one other component element in the plasma phase; and
   at least one further component element vapour is provided;
   wherein reaction of the component elements to form the chemical compound occurs on the surface of the substrate, and not in the vapour phase prior to deposition.

2. A physical vapour deposition process according to claim 1, wherein the vapour provided using a thermal cracking effusion source is selected from cracked phosphorus, cracked sulphur, cracked arsenic, cracked selenium, cracked antimony and cracked tellurium.

3. A physical vapour deposition process according to claim 2, wherein the vapour provided using a thermal cracking effusion source is cracked phosphorus or cracked sulphur.

4. A physical vapour deposition process according to claim 3, wherein the vapour provided using a thermal cracking effusion source is cracked phosphorus.

5. A physical vapour deposition process according to claim 1, wherein the at least one other component element provided using a plasma source is selected from oxygen, nitrogen and hydrogen.

6. A physical vapour deposition process according to claim 5, wherein the at least one other component element provided using a plasma source is oxygen.

7. A physical vapour deposition process according to claim 1, wherein the at least one further component element vapour is provided using an effusion cell source or using an electron beam evaporator source.

8. A physical vapour deposition process according to claim 1, wherein the at least one further component element is a metal or is selected from silicon, boron and carbon.

9. A physical vapour deposition process according to claim 8, wherein the at least one further component element is a metal.

10. A physical vapour deposition process according to claim 9, wherein the metal is selected from lithium, sodium, magnesium, calcium, a transition metal having an atomic number of 72 or less, aluminium, gallium, indium, germanium, tin, and lead.

11. A physical vapour deposition process according to claim 10, wherein the metal is selected from lithium, iron, aluminium, titanium, germanium, calcium, tin and cobalt.

12. A physical vapour deposition process according to claim 11, wherein the metal is selected from lithium and iron.

13. A physical vapour deposition process according to claim 11, wherein the metal is lithium.

14. A physical vapour deposition process according to claim 1, wherein the component elements of the chemical compound are phosphorus, oxygen, and one or more metals, and wherein the chemical compound is a metal phosphate or mixed metal phosphate.

15. A physical vapour deposition process according to claim 14, wherein the component elements of the chemical compound further comprise nitrogen, and wherein the chemical compound is a nitrogen-doped metal or mixed metal phosphate.

16. A physical vapour deposition process according to claim 1, wherein the stoichiometry of the chemical compound is controlled by controlling the rate of deposition of each component element onto the substrate.

17. A physical vapour deposition process according to claim 1, wherein one or more of the component elements is/are deposited on the substrate with a concentration that varies across at least a portion of the substrate.

18. A physical vapour deposition process according to claim 17, wherein a series of chemical compounds having different stoichiometries is prepared on said at least a portion of the substrate.

19. A physical vapour deposition process according to claim 1, wherein a heated substrate is used.

20. A physical vapour deposition process according to claim 1, wherein annealing is carried out following deposition.

21. A process for the manufacture of a battery, wherein the process includes a physical vapour deposition process according to claim 1.

22. A process according to claim 21, wherein the battery is a lithium ion battery.

* * * * *